United States Patent [19]

Mueller

[11] Patent Number: 4,841,163
[45] Date of Patent: Jun. 20, 1989

[54] PROXIMITY SWITCH IMMUNE TO INTERFERENCE FIELDS

[75] Inventor: Jens Mueller, Radevormwald, Fed. Rep. of Germany

[73] Assignee: Werner Turck GmbH Co., KG., Halver, Fed. Rep. of Germany

[21] Appl. No.: 155,770

[22] Filed: Feb. 16, 1988

[30] Foreign Application Priority Data

Feb. 17, 1987 [DE] Fed. Rep. of Germany ....... 3704893

[51] Int. Cl.$^4$ ...................... H01H 35/00; G08B 13/00
[52] U.S. Cl. ..................................... 307/116; 307/117; 340/565; 361/180
[58] Field of Search ................. 307/116, 117; 361/179, 361/180; 340/551, 565–567

[56] References Cited

U.S. PATENT DOCUMENTS

| 4,037,221 | 7/1977 | Alexander | 307/116 X |
| 4,250,432 | 12/1981 | Kohler | 307/116 X |
| 4,307,387 | 12/1981 | Baxendale | 307/117 X |
| 4,587,486 | 5/1986 | Soyck | 324/236 |
| 4,651,022 | 3/1987 | Cowley | 307/116 |
| 4,673,827 | 6/1987 | Summer | 307/116 |
| 4,719,362 | 1/1988 | Nest et al. | 307/116 |

FOREIGN PATENT DOCUMENTS

| 0179384 | 10/1985 | European Pat. Off. . |
| 0169582 | 1/1986 | European Pat. Off. . |
| 0171013 | 2/1986 | European Pat. Off. . |
| 2815711 | 1/1980 | Fed. Rep. of Germany . |
| 3313326 | 10/1984 | Fed. Rep. of Germany . |
| 3606586 | 9/1986 | Fed. Rep. of Germany . |
| 2477807 | 9/1981 | France . |

Primary Examiner—William M. Shoop, Jr.
Assistant Examiner—Sharon D. Logan
Attorney, Agent, or Firm—Antonelli, Terry & Wands

[57] ABSTRACT

A proximity switch immune to interference fields includes an oscillator circuit (1) that can be influenced by a permanent magnet, this circuit being damped in the basic condition by a core of a coil (13), which core consists of an amorphous metal, and being undampable by the approach of the permanent magnet. In order to prevent triggering of the proximity switch by a magnetic alternating field, a signal evaluating circuit (2), yielding a switching signal corresponding to the undamped condition of the oscillator circuit (1), and a signal evaluating circuit (8) are connected to the oscillator circuit output (17). The signal evaluating circuit (8) detects an output signal produced by a magnetic alternating field separately as interference and blocks, by way of a blockable holding circuit (5), the switching signal path so long as a magnetic alternating field is present.

3 Claims, 2 Drawing Sheets

PROXIMITY SWITCH IMMUNE TO INTERFERENCE FIELDS

BACKGROUND OF THE INVENTION

The invention relates to a proximity switch immune to interference fields, with an oscillator circuit that can be influenced by a permanent magnet, which oscillator circuit is damped in its basic condition by a coil core consisting of an amorphous metal and which can be undamped by the approach of the permanent magnet, and with a first signal evaluating circuit in the form of a multivibrator stage, connected to the oscillator output, this signal evaluating circuit yielding an output signal corresponding to the undamped condition of the oscillator.

Such proximity switches immune to interference fields are required in cases wherein interference fields occur within the range of the proximity switch, which can lead to faulty switching operations. This is the case, for example, when using proximity switches for signaling the positions of pistons in pneumatic cylinders utilized in welding plants, specifically in remotely operated welding equipment. The power feed cables for the electrical welding units, extended past the pneumatic cylinders in the proximity of the switches, can generate such high magnetic fields that they result in faulty switching in unprotected proximity switches.

A proximity switch immune to interference fields has been known from EP-OS No. 01 79 384 wherein each proximity switch contains respectively two sensor portions, responsive to the approach, and wherein the difference of the signals in the two sensor portions is evaluated. On account of the spatial arrangement of the two sensor portions, the difference in the signals when generated by interference fields is substantially smaller than in case of signals produced by the approache. Therefor, the effects of interference fields are substantially diminished. This conventional arrangement, however, is possible only in case of proximity switches, the sensors of which cannot be magnetically saturated, or can be saturated only with difficulty. When using saturable sensors, the sensors in that arrangement would, in case of saturation, exhibit signals of the same level so that difference evaluation would no longer be possible.

Furthermore, DOS No. 2,815,711 discloses a proximity switch comprising an oscillator arrangement responsive to a metallic control lug. In order to prevent falsification of the output signal of the proximity switch unintentionally due to electromagnetic alternating fields, changes in the condition of the oscillator are purposely delayed with respect to time when transposed into the corresponding changes in the output signal of the proximity switch. In this conventional arrangement, suppression of faulty output signal conditions that could be caused by electromagnetic alternating fields is attained only if it can be assumed that the duration of time during which the interfering electromagnetic alternating fields are effective is limited and known. This is so in specific usages, for example in case it is certain that the interfering magnetic alternating fields are at a sufficiently low level for an adequate period of time in the proximity of their respective zero-axis crossings. The modulation limit of the amorphous metallic core is 1/100 to 1/1000 of that of a ferrite core. In sinusoidal modulation with magnetic fields, the metallic core is saturated within 1/100 to 1/1000 of the time during which a ferrite core is saturated. In case of a proximity switch with triggering by a permanent magnet, the time periods available for the timed setback of the activating delay times are so short that the timed gating in the zero-axis crossing of the interfering magnetic alternating field provided in this arrangement is impossible with proximity switches with triggering by permanent magnets.

SUMMARY OF THE INVENTION

The invention is based on the object of providing a proximity switch immune to interference fields with triggering by a permanent magnet, this switch being reliably protected against falsification of the output signal of the proximity switch by interfering magnetic alternating fields, in spite of the use of readily magnetically saturable, amorphous metal in the oscillator coil core.

This object has been attained by a proximity switch having the features set forth below. The decisive aspect of the invention resides in that an effect exerted by interfering magnetic alternating fields is detected as such, i.e. as interference, and is applied as a blocking signal, lasting for the duration of the effect, to a blockable holding circuit. Thereby, the output signal of the proximity switch is held at the condition prevailing prior to the occurrence of the interfering influence. It thus remains certain that the gripper devices, operated, for example, by the pneumatic cylinders monitored by the proximity switches of this invention, are securely retained in their position during the welding procedure and therefore can be opened again and adjusted only after termination of the welding step, and thus after the disappearance of the interfering magnetic alternating fields caused by the welding currents.

BRIEF DESCRIPTION OF THE DRAWINGS

The proximity switch of this invention will be described below with reference to the figures wherein.

DETAILED DESCRIPTION OF A PREFERRED EMBODIMENT

Figure 1:
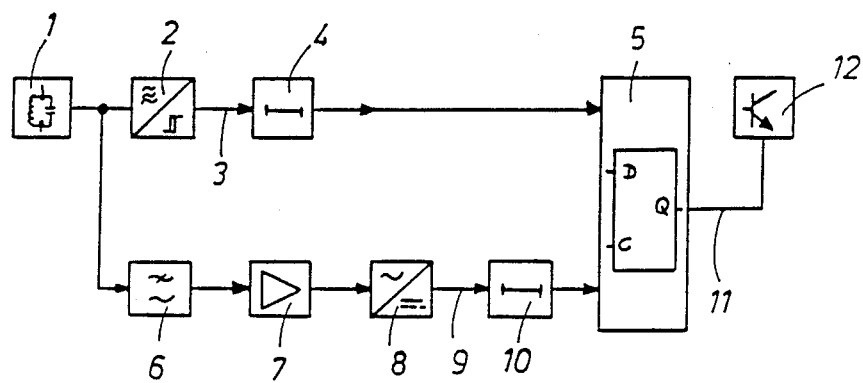
FIG. 1 shows a general block circuit diagram of the proximity switch according to the invention.

The block circuit diagram of FIG. 1 shows an oscillator circuit 1 as the sensor portion of the proximity switch, this circuit being undamped upon the approach of a permanent magnet and delivering its output to a signal evaluating circuit 2, the latter yielding at its output 3 a binary signal by way of a delay stage 4 to the D input of a blockable holding circuit 5.

The oscillator circuit 1 can likewise be undamped by an interference alternating field, and in such a case a signal is likewise transmitted via the signal evaluating circuit 2 and the delay stage 4 to the D input of the holding circuit 5.

Furthermore, the output of the oscillator circuit 1 is connected to a filter 6 which detects only an output signal having the interference frequency and converts the same, by way of an amplifier 7 and an evaluating circuit 8, into a binary signal at the output 9, which latter signal is transmitted via a delay circuit 10 to the C input of the blockable holding circuit 5. In case an interference signal is present at the C input, the holding circuit is blocked for the useful signal path 2, 3, 4, and the signal at the output 11 of the holding circuit 5 remains at the last-assumed value. If no signal is present at the C input, which is equivalent to absence of an interference field, then the output of the oscillator circuit 1 is normally switched through via signal route 2, 3, 4 and the holding circuit 5, and thus the final stage 12 is activated.

The aforementioned circuit arrangement will be described in greater detail below with reference to the detailed circuit diagram of FIG. 2. The oscillator circuit 1 consists of an oscillator circuit coil 13, the core of which contains readily magnetically saturable, amorphous metal, and of a capacitor 14. In this arrangement, this oscillator circuit 1 is damped in the basic condition by the amorphous material. Upon the approach of a permanent magnet, the amorphous material is saturated and thereby the oscillator circuit 1 is undamped. The oscillator and evaluating circuit 2 consists of an oscillator 15 and an inverting multivibrator stage 16. This oscillator and evaluating circuit 2 operates the oscillator circuit 1 and transmits at its output 3 a binary signal corresponding to the damped and, respectively, undamped condition of the oscillator circuit 1. In this arrangement, thus far conventional, the signal present at the output 3 of the oscillator and evaluating circuit 2 in the undamped condition does not reveal whether the undamping has been produced intentionally by the approach of a permanent magnet or unintentionally by the effect of an interfering electromagnetic alternating field.

In order to assure that undamping of the oscillator circuit 1, caused by an interference field, does not lead to switching over of the final stage 12, the output of the oscillator circuit 1 is additionally connected, according to this invention, via a filter 6 and an amplifier 7 to an interference evaluating circuit 8. In this arrangement, the filter 6 and the interference evaluating circuit 8 are adapted in such a way that the interference evaluating circuit 8 does not respond to the approach and/or receding of the permanent magnet. Rather, the interference evaluating circuit 8 is designed with special sensitivity with respect to the signals generated by magnetic alternating fields, i.e. in case of interference fields caused by mains frequency, with respect to the mains frequency. The interference evaluating circuit thus yields at its output 9 a binary signal, the condition of which depends on the presence or absence of an interfering effect on the oscillator circuit 1.

The two binary signals at outputs 3 and 9 are transmitted to the blockable holding circuit 5, the signal of which, appearing at its output 11, already corresponds to the output signal of the proximity switch of this invention. In this connection, this holding circuit 5 is designed so that the signal conditions transmitted from the output 3 of the oscillator and evaluating circuit 2 are further transmitted to the output 11 of the holding circuit 5 in case, and only in case, the signal coming from the output 9 of the interference evaluating circuit 8 confirms that there is no magnetic alternating field acting on the oscillator circuit 1. In this instance, therefore, the signal at the output 11 of the holding circuit 5 corresponds to the approach condition at the oscillator circuit 1. In contrast thereto, if the signal at the output 9 of the interference evaluating circuit 8 indicates that the oscillator circuit 1 is affected by a magnetic alternating field, the signal transmitted from the output 3 of the oscillator and evaluating circuit 2 is blocked and the signal condition prevailing at the output 11 of the holding circuit 5 is maintained unchanged, independently of the condition assumed by the signal at the output 3 of the oscillator and evaluating circuit 2.

This ensures that the output 11 and thus also the output of the entire proximity switch are controlled, as intended, only by the approach condition of the permanent magnet, and that the output cannot be falsified by the effect of magnetic alternating fields on the oscillator circuit 1.

Figure 2:
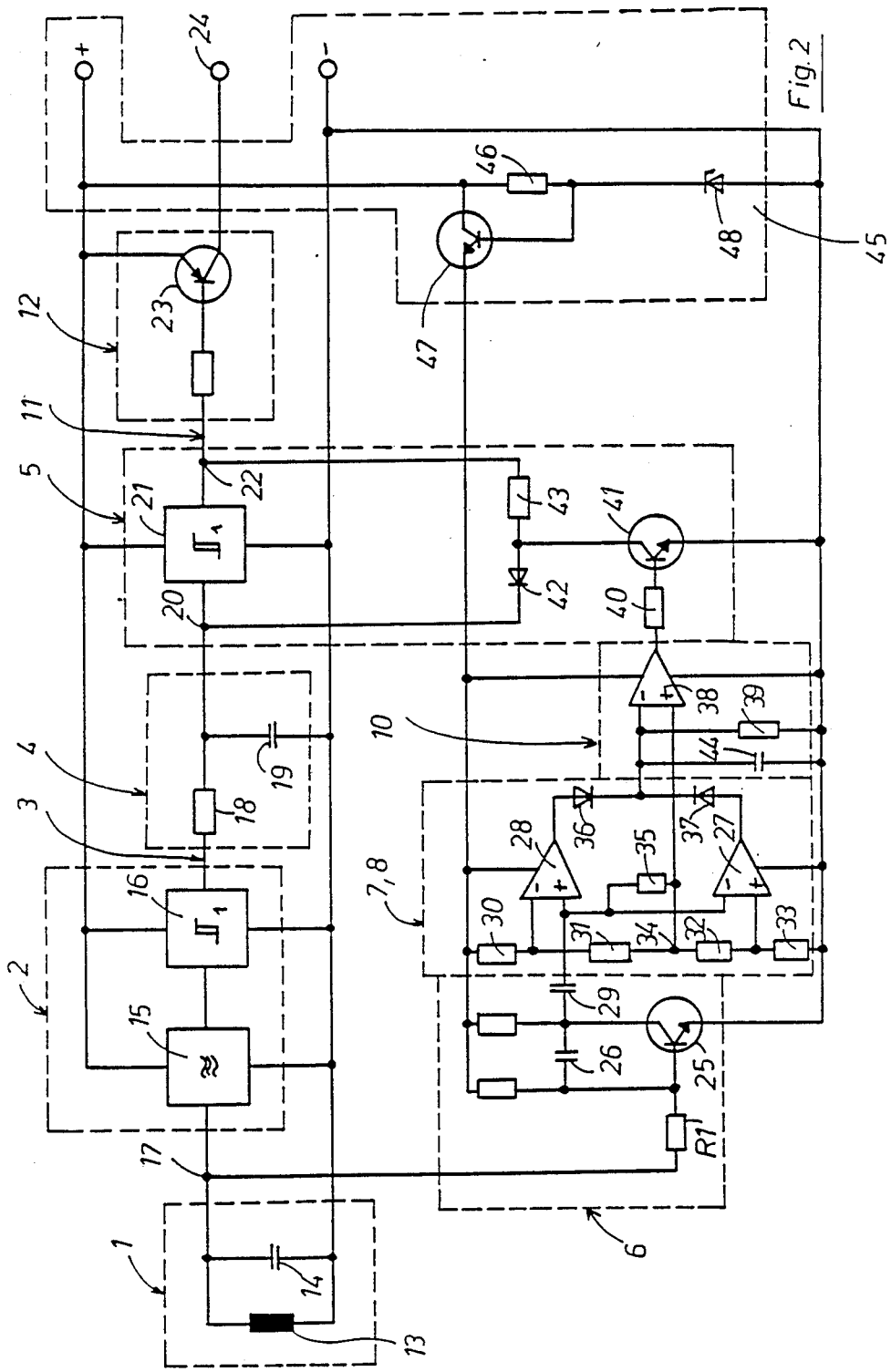
FIG. 2 shows a detailed circuit diagram in association with the block circuit diagram of FIG. 1.

Referring to the circuit according to FIG. 2, the function of the proximity switch in the condition not affected by magnetic alternating fields will be described, the upper portion of FIG. 2 illustrating the portion of the circuit that processes the switching signal.

The oscillator 15 operates the oscillator circuit 1. The analog signal present at junction point 17 and dependent on the damping condition is transmitted to the inverting multivibrator stage 16, at the output 3 of which a binary signal is then present, as has been described with reference to FIG. 1. The resistor 18 and the capacitor 19 constitute the delay member 4 according to FIG. 1; and via this delay member, the binary signal passes from input 3 to the output 20 of a further multivibrator stage 21. This multivibrator stage 21 is part of the blockable holding circuit 5 according to FIG. 1. In the uninfluenced condition, the signal at the output 22 of the multivibrator stage 21, which signal is identical to the output 11 of the holding circuit 5, corresponds to the signal at input 20 and thus corresponds to the damping condition and consequently also to the approach condition of a permanent magnet. From the switching point 22, the binary signal acts on the base of the switching transistor 23 forming the final stage 12 of FIG. 1. The emitter of the transistor 23, which latter is blocked or conductive, depending on the approach condition, leads to the signal output 24 of the proximity switch.

The bottom portion of the circuit of FIG. 2 shows the arrangement for the detection and evaluation of interference effects due to magnetic alternating fields.

The analog signal present at the oscillator circuit 1 is transmitted from point 17 via a resistor R1 to the base of a transistor 25. The transistor 25 herein does not amplify the high-frequency oscillator signals because it has extreme negative feedback, due to the capacitor 26, with respect to these high-frequency signals.

So long as no interfering magnetic alternating field exists, i.e. no voltages of interference frequency are induced in the oscillator circuit coil 13 and transmitted via 17, the resistor R1 to the transistor 25, the comparators 27 and 28, the inputs of which are connected to a capacitor 29 and to a voltage divider 30, 31, 32, 33, remain in the rest condition, as will be demonstrated below: Since half of the supply voltage drops across each half of the voltage divider 30, 31, 32, 33, the middle potential at point 34 is applied via the resistor 35 to the positive input of comparator 28 and to the negative input of comparator 27. The negative input of comparator 28 lies above its positive input by the voltage drop at the resistor 31 so that the output of comparator 28 assumes the negative potential of the circuit. Furthermore, the positive input of comparator 27 lies below its negative input by the voltage drop at the resistor 32, so that also the output of the comparator 27 assumes the negative potential of the circuit. As a result, there is no current flow through the diode 36 or through the diode 37, and the negative input of a further comparator 38 is connected via the resistor 39 to the negative potential of the circuit. Since the positive input of comparator 38 lies at the middle potential at point 34, it is higher than the potential at the negative input so that the output of comparator 38 lies at the positive potential of the circuit. The current then flowing via the resistor 40 into the base of transistor 41 renders the latter conductive.

The conductive transistor 41 connects the input 20 of the multivibrator stage 21, via the diode 42 in the blocking direction to the negative potential of the circuit. Likewise, the output 22 of the multivibrator stage 21 is connected via the resistor 43 to the negative potential. Neither process exerts any influence on the signals at the multivibrator stage 21, and therefore no influence is exerted, either, on the above-described function of the circuit illustrated in the upper portion of FIG. 2. Thus, this portion operates as disclosed above, in the condition not affected by interfering magnetic fields.

In the presence of an interfering magnetic alternating field, the latter induces, in the coil 13 of the oscillator circuit 1, an alternating voltage of the interference frequency, heterodyned over the high-frequency oscillating voltage of the oscillator. These heterodyned voltages are applied from point 17 to the base of transistor 25 via the resistor R1. The high-frequency oscillator signal is not amplified in this process, as described above, on account of the high-frequency negative feedback via capacitor 26. The proportion of interference frequency, i.e. of low frequency, is, in contrast thereto, effective with about 100-fold amplification at the collector of transistor 25. By way of capacitor 29, the thus-amplified signal of the interference frequency passes to the inputs of comparators 27 and 28. If the amplitude of the positive half wave of the voltage of the interference frequency at the positive input of comparator 28 exceeds the voltage at its negative input, its output switches, for the period of such exceeding, to the positive potential of the circuit. If the amplitude of the negative half wave of the voltage of the interference frequency at the negative input of the comparator 27 falls below the voltage at its positive input, then its output, for the time of such falling below, likewise switches to the positive potential of the circuit. Thus, positive pulses pass alternatingly via the diode 36 and via the diode 37 to the capacitor 44 and to the negative input of comparator 38. In case of weak interference fields, pauses are produced between the individual positive pulses, for example lasting 8 milliseconds, at an interference frequency of 50 Hz. These lulls are bridged by the delay member 10 containing the capacitor 44 and the resistor 39, in that the capacitor 44 is charged alternatingly by way of the diodes 36 and 37, and the voltage at the negative input of comparator 38 is maintained by this capacitor at a positive potential for the period of the lull. In case of relatively strong interference fields, the thus-produced pauses are shorter; they are likewise bridged in the manner described above.

If, now, the charging voltage at the capacitor 44, and thus the voltage at the negative input of comparator 38, exceed the center voltage of point 34 at the positive input of comparator 38, the output of the latter switches to the negative potential of the circuit. Thus, the transistor 41 becomes nonconductive, and a holding current can flow from the output 22 of the multivibrator stage 21 via the resistor 43 and the diode 42 to the input 20 of the multivibrator stage 21. Thereby, this multivibrator stage 21 is maintained in the given switching condition with the result that the output 24 of the proximity switch also remains in the previous condition. This effect prevails so long as a correspondingly high interfering magnetic alternating field acts on the oscillator circuit 1.

The delay of the delay member 4 in the useful signal branch is made longer than the delay of the transit time in the interference signal branch. This brings about the result that upon occurrence of interfering magnetic alternating fields the blocking or holding effect at the blockable holding circuit 5 at point 20 arrives earlier than the useful signal falsification from the oscillator and evaluating circuit 2.

FIG. 2 furthermore also shows the supply and stabilizing circuit 45 for powering the proximity switch. The circuit 45 comprises a resistor 46 connected between the positive and negative supply lines; the collector-base path of a transistor 47 is connected in parallel to this resistor. A Zener diode 48 is connected with its cathode to the base of transistor 47 and with its anode to the negative potential.

The proximity switch of this invention thus cannot change its output signal as long as interfering magnetic alternating fields act on the proximity switch.

I claim:

1. A proximity switch immune to interference fields comprising:
    an oscillator circuit (1) including a coil (13) having an amorphous metal core, said oscillator circuit being controllable by a permanent magnet and being damped in its basic condition by the core of the coil and being undampable by the approach of a permanent magnet,
    a first signal evaluating circuit (2) connected to the oscillator circuit output (17) and providing an output signal corresponding to the undamped condition of the oscillator circuit (1),
    a blockable holding circuit (5) in the form of a D flip-flop with a switching signal input (D) having the output (3) of the first signal evaluating circuit (2) connected thereto, and with a blocking signal input (C),
    a filter (6) tuned to the frequency of the interfering alternating magnetic field to be considered,
    a second signal evaluating circuit (8) including a multivibrator stage, the second signal evaluating circuit being connected via the filter to the oscillator circuit output (17), for transmitting via the multivibrator stage a blocking signal, continuous over the duration of the interference, to the blocking signal input (C) of the blockable holding circuit (5) only upon the occurrence of an oscillator circuit output signal of the frequency of the interfering alternating magnetic field, the holding circuit being responsive to the blocking signal by retaining the output (11) of the holding circuit at the last-assumed value thereof so that the output of the holding circuit (5) can no longer be influenced by the approach or distancing of the permanent magnet,
    a final stage (12) connected to the holding circuit output (11) and including an electronic switch for the circuit to be switched and a firing device for the electronic switch, and
    a supply circuit for the oscillator circuit (1) and the two signal evaluating circuits (2 and 8).

2. A proximity switch according to claim 1, further comprising a first delay member (4) for transmitting the output signal of the first signal evaluating circuit (2), with a time delay, to the holding circuit (5).

3. A proximity switch according to claim 1 or 2, further comprising a second delay member (10) for transmitting a signal change at the output (9) of the second signal evaluating circuit (8), occurring on account of the absence of an effect of foreign magnetic interference fields, to the holding circuit (5) with a time delay as compared with a signal change occurring at the output (3) of the first signal evaluating circuit (2) on account of the absence of an effect of the foreign magnetic interference fields.

* * * * *